United States Patent
Katsumura et al.

(10) Patent No.: US 9,431,994 B2
(45) Date of Patent: Aug. 30, 2016

(54) PIEZOELECTRIC RESONATOR INCLUDING AN ADJUSTING MAGNET

(71) Applicant: PANASONIC CORPORATION, Osaka (JP)

(72) Inventors: Hidenori Katsumura, Hyogo (JP); Hiroshi Kagata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 127 days.

(21) Appl. No.: 14/371,417

(22) PCT Filed: Feb. 8, 2013

(86) PCT No.: PCT/JP2013/000697
§ 371 (c)(1),
(2) Date: Jul. 9, 2014

(87) PCT Pub. No.: WO2013/121759
PCT Pub. Date: Aug. 22, 2013

(65) Prior Publication Data
US 2014/0327339 A1 Nov. 6, 2014

(30) Foreign Application Priority Data

Feb. 16, 2012 (JP) ................................ 2012-031280
Feb. 27, 2012 (JP) ................................ 2012-039602

(51) Int. Cl.
H03H 9/19 (2006.01)
H03H 9/17 (2006.01)
(Continued)

(52) U.S. Cl.
CPC ............ *H03H 9/17* (2013.01); *H01L 41/1134* (2013.01); *H01L 41/1136* (2013.01); *H02N 2/188* (2013.01); *H03H 2009/02165* (2013.01)

(58) Field of Classification Search
CPC ............ H01L 41/0933; H01L 41/094; H01L 41/1134; H01L 41/1136; H03H 9/17; H03H 9/2447; H03H 9/2452; H03H 9/2457; H03H 9/2463; B06B 1/0603
USPC .................................................. 310/330–332
See application file for complete search history.

(56) References Cited

U.S. PATENT DOCUMENTS 5,594,331 A  1/1997 White et al.
6,297,502 B1 10/2001 Jarvis et al.
(Continued)

FOREIGN PATENT DOCUMENTS

JP  51-009357 A  1/1976
JP  2000-019092 A  1/2000
JP  2003-114186 A  4/2003

OTHER PUBLICATIONS

Richard White, "Demand Response: Passive Proximity Electric Sensing," Demand Response Enabling Technologies Development Workshop, Jun. 10, 2004 p. 1-17, (http://uc-ciee.org/all-documents/a/150/113/nested).

(Continued)

Primary Examiner — J. San Martin
(74) Attorney, Agent, or Firm — McDermott Will & Emery LLP

(57) ABSTRACT

A piezoelectric resonator including a base part, a first support part fixed to the base part, a beam part fixed to the first support part, a weight part fixed to the beam part, a drive unit provided on the beam part, and an adjusting magnet movable on a main surface of the base part. Furthermore, the weight part is formed of a magnet or a magnetic body, and the beam part extends in a direction along the main surface of the base part. With this configuration, displacement of the resonance frequency generated due to variation in a manufacturing process can be adjusted easily. Even when the resonance frequency is displaced from desired resonance frequency due to variation in the manufacturing process of a power generating element, the displacement can be easily adjusted and maximum efficiency can be obtained.

10 Claims, 24 Drawing Sheets

(51) Int. Cl.
*H01L 41/113* (2006.01)
*H02N 2/18* (2006.01)
*H03H 9/02* (2006.01)

(56) References Cited

U.S. PATENT DOCUMENTS

| | | | | |
|---|---|---|---|---|
| 2008/0264537 A1* | 10/2008 | Behrends | ............... | B60C 23/041 152/152.1 |
| 2009/0261689 A1* | 10/2009 | Fang | ................... | H02N 2/186 310/319 |
| 2011/0221307 A1* | 9/2011 | Liu | ................... | B81B 3/0072 310/325 |
| 2011/0233693 A1* | 9/2011 | Perruchot | ............. | B81B 3/0072 257/417 |
| 2012/0267982 A1* | 10/2012 | Carman | ................ | H02N 2/186 310/318 |
| 2013/0154439 A1* | 6/2013 | Lee | ................... | H01L 41/1136 310/314 |

OTHER PUBLICATIONS

International Search Report issued in International Application No. PCT/JP2013/000697 with mailing date of Apr. 16, 2013, with English Translation.

\* cited by examiner

PIEZOELECTRIC RESONATOR INCLUDING AN ADJUSTING MAGNET

RELATED APPLICATIONS

This application is a national phase of International Application No. PCT/JP2013/000697, filed on Feb. 8, 2013, which in turn claims the benefit of Japanese Application No. 2012-031280, filed on Feb. 16, 2012 and Japanese Application No. 2012-039602, filed on Feb. 27, 2012, the disclosures of which Applications are incorporated by reference herein.

TECHNICAL FIELD

The present invention relates to a piezoelectric resonator, and particularly to a configuration capable of adjusting a resonance frequency.

BACKGROUND ART

Since resonators including a piezoelectric body can be miniaturized by using a semiconductor process or the like, in recent years, the application areas thereof including a power generating element, various types of actuators, and the like, have been extended.

FIG. 24 shows one example of a sensor module placed in power supply line 110 in which power generating element 101 is used as a driving power source.

Power generating element 101 includes beam part 102 and piezoelectric body 104. Piezoelectric body 104 is provided on a main surface of beam part 102 and sandwiched between upper electrode 105 and lower electrode 103. Weight part 106 made of a permanent magnet is attached to an end portion of beam part 102. Beam part 102 is vibrated by interaction with a magnetic field change, which is caused by an AC current flowing in power supply line 110, in the vicinity of power supply line 110.

Hereinafter, beam part 102 together with upper electrode 105, lower electrode 103, and piezoelectric body 104 are defined as a beam. Actually, not only beam part 102 but also a whole beam including upper electrode 105, lower electrode 103, and piezoelectric body 104 is vibrated.

Distortion generated by the vibration of the beam generates electric charges proportional to pressure by a piezoelectric effect of piezoelectric body 104, thus generating a voltage. Since the generated voltage has a size proportion to an amount of an electric current flowing in power supply line 110, control unit 109, which monitors the voltage generated in piezoelectric body 104 and wirelessly transmits the monitored results, serves also as a current sensor. Electric power necessary for storage, processing, transmission, or the like of sensor information in control unit 109 is covered by electric power generated by power generating element 101, thus achieving a sensor module that does not need to be supplied with electric power from a battery or outside.

Note here that prior art literature information on the invention of the present application includes, for example, Patent Literature 1 and Non-Patent Literature 1.

However, the above-mentioned power generating element needs to match an alternating-current frequency of power supply line 110 and a resonance frequency of power generating element 101 with each other in order to obtain maximum generating efficiency. However, the resonance frequency tends to vary due to variation in manufacturing processes because the resonance frequency depends upon a length, a thickness, a weight of weight part 106 attached to the end portion of beam part 102, and the like.

CITATION LIST

Patent Literature

PTL 1: U.S. Pat. No. 5,594,331

Non-Patent Literature

Non-PTL 1: Richard White, "Demand Response: Passive Proximity Electric Sensing" Demand Response Enabling Technologies Development Workshop, Jun. 10, 2014, p. 1-17

SUMMARY OF THE INVENTION

The present invention includes a base part, a first support part fixed to the base part, a beam part fixed to the first support part, a weight part fixed to the beam part, a drive unit provided on the beam part, and an adjusting magnet movable on a main surface of the base part. The weight part is formed of a magnet or a magnetic body, and the beam part extends in a direction along the main surface of the base part.

According to this configuration, displacement of a resonance frequency, which is generated due to variation in a manufacturing process, can be easily adjusted.

Even when the resonance frequency is displaced from a desired resonance frequency due to variation in a manufacturing process of a power generating element, the resonance frequency can be easily adjusted, and maximum efficiency can be obtained.

DESCRIPTION OF EMBODIMENTS

Hereinafter, exemplary embodiments of the present invention are described.

First Exemplary Embodiment

A configuration of a beam (a vibration part) of a piezoelectric resonator in accordance with a first exemplary embodiment is described with reference to FIG. 1.

<Configuration of Beam Part>

Figure 1:
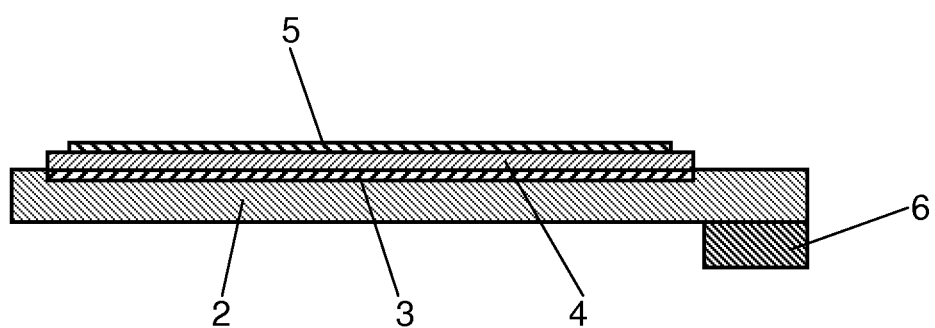
FIG. 1 is a view showing a configuration of a beam of a piezoelectric resonator in accordance with a first exemplary embodiment of the present invention.

FIG. 1 is a schematic configuration view of a beam (a vibration part) of a piezoelectric resonator in accordance with the first exemplary embodiment. Lower electrode 3, piezoelectric body 4, and upper electrode 5 are laminated sequentially on a main surface of beam part 2 made of a metal substrate. Weight part 6 is fixed to at least one end portion of beam part 2. Weight part 6 is made of a permanent magnet or a magnetic body. Lower electrode 3, piezoelectric body 4, and upper electrode 5 form a drive unit. In other exemplary embodiments, a drive unit is formed of lower electrode 3, piezoelectric body 4, and upper electrode 5.

Hereinafter, as in the background art, beam part 2 together with upper electrode 5, lower electrode 3, and piezoelectric body 4 are defined as a beam.

Hereinafter, an example of a method for manufacturing the vibration part (the beam) of the piezoelectric resonator in accordance with the present invention is described.

For beam part 2, a stainless steel plate (SUS430) having a thickness of 0.15 mm is used. The stainless steel plate has a dimension of 3×20 mm.

Ag—Pd alloy paste is screen-printed on the stainless steel plate to form lower electrode 3. Then, paste for printing a piezoelectric body is printed on lower electrode 3 by using a metal mask to form piezoelectric body 4. Furthermore, Ag—Pd alloy paste is screen-printed on piezoelectric body 4 to form upper electrode 5. These are kept in the air at 875° C. for two hours to be fired. After firing, the thickness of piezoelectric body 4 is 20 μm, and each of thicknesses of lower electrode 3 and upper electrode 5 is 3 μm. Furthermore, a neodymium permanent magnet (weight part 6) having a weight of 0.38 g and a dimension of 5×5×2 mm is fixed to the end portion of beam part 2 with an adhesive agent.

It is desirable that piezoelectric material to be used for piezoelectric body 4 includes a composition which is densely sintered at a low temperature and has excellent piezoelectric characteristics.

In this exemplary embodiment, the piezoelectric material having a composition represented by Formula 1 is used.

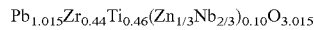

Formula 1:

This composition is in a composition range disclosed in Japanese Patent No. 4403967 proposed by the present applicant and is known to show excellent piezoelectric characteristics. The composition is characterized in that a B-site of PZT is substituted with $Pb(Zn_{1/3}Nb_{2/3})O_3$ in 10 mol %, and that a Pb site ratio is 1.015 which is excess as compared with the stoichiometry.

Piezoelectric material composition powder having a molar ratio represented by Formula 1 is synthesized by a well-known solid phase method by using powders of lead oxide (PbO), titanium oxide ($TiO_2$), zirconium oxide ($ZrO_2$), zinc oxide (ZnO), and niobium oxide ($Nb_2O_5$) having a purity of 99.9% or more as raw material. For densely sintering at a temperature of less than 900° C., the powders are pulverized to an average particle diameter ($D_{50}$) of less than 0.5 μm.

When the piezoelectric characteristics of the obtained piezoelectric material are measured according to a method described in JEITA EM-4501, the obtained piezoelectric material has excellent piezoelectric characteristics, that is, mechanical coupling coefficient $k_p$ of 0.60 and a piezoelectric constant $d_{31}$ of −125 pm/V.

Next, a method for producing paste for printing a piezoelectric body is described. An organic vehicle including an organic binder and a solvent at a blending ratio of, for example, 2:8 is prepared. Examples of the organic binder include ethyl cellulose resin, acrylic resin, butyral resin, and the like. Examples of the solvent include α-terpineol, butyl carbitol, and the like. The organic vehicle and the above-mentioned pulverized powder of piezoelectric material are weighed at a weight ratio of, for example, 20:80, and they are mixed together with an appropriate amount of a dispersing agent. Thereafter, the mixture is kneaded by using a three-ball mill to produce paste for printing the piezoelectric body.

For formation of upper electrode 5 and lower electrode 3, commercially available silver-palladium alloy paste (weight ratio of silver to palladium=90:10, average particle diameter: 0.9 μm) is used.

<Configuration of Piezoelectric Resonator>

Next, a configuration of the piezoelectric resonator of the first exemplary embodiment is described with reference to FIG. 2.

Figure 2:
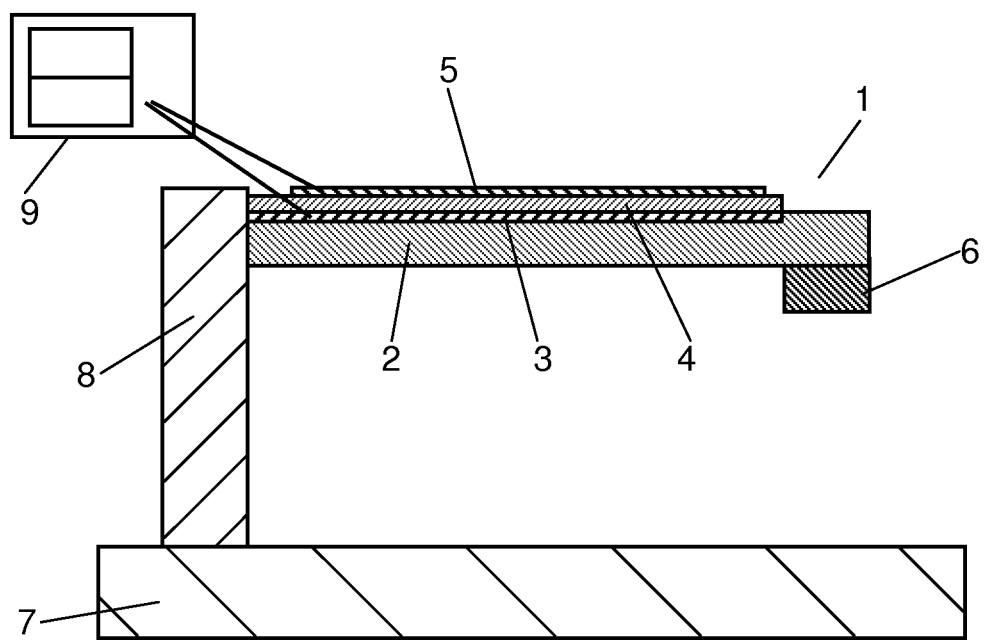
FIG. 2 is a view showing a configuration of the piezoelectric resonator in accordance with the first exemplary embodiment of the present invention.

As shown in FIG. 2, in piezoelectric resonator 1 of the first exemplary embodiment, one end portion of beam part 2 is fixed by support part 8, and support part 8 is fixed to base part 7. Beam part 2 is fixed by support part 8 in such a manner that at least one main surface of beam part 2 is substantially parallel on a main surface of fixed base part 7. In this exemplary embodiment, beam part 2, support part 8, and base part 7 are provided separately. However, the same effect can be obtained when beam part 2, support part 8, and base part 7 are formed unitarily with each other.

As one example of a fixing method for beam part 2, support part 8, and base part 7, support part 8 is fixed to base part 7 by using, for example, a bolt. Then, support part 8 is fixed to an end portion of beam part 2 to which weight part 6 is not fixed.

<Evaluation Method for Operation Characteristics>

Next, an evaluation method for vibration characteristics of piezoelectric resonator 1 in accordance with the first exemplary embodiment of the present invention is described with reference to FIGS. 2 and 3.

When base part 7 is fixed to a vibration generator (not shown) so as to vibrate piezoelectric resonator 1 by the vibration generator, a voltage is generated in piezoelectric body 4 by a piezoelectric effect. A change of the voltage in lower electrode 3 and upper electrode 5 with respect to a vibration frequency is measured by using oscilloscope 9, and the resonance frequency of piezoelectric resonator 1 of the present invention can be obtained from the vibration frequency when the generated voltage becomes maximum.

Figure 3:
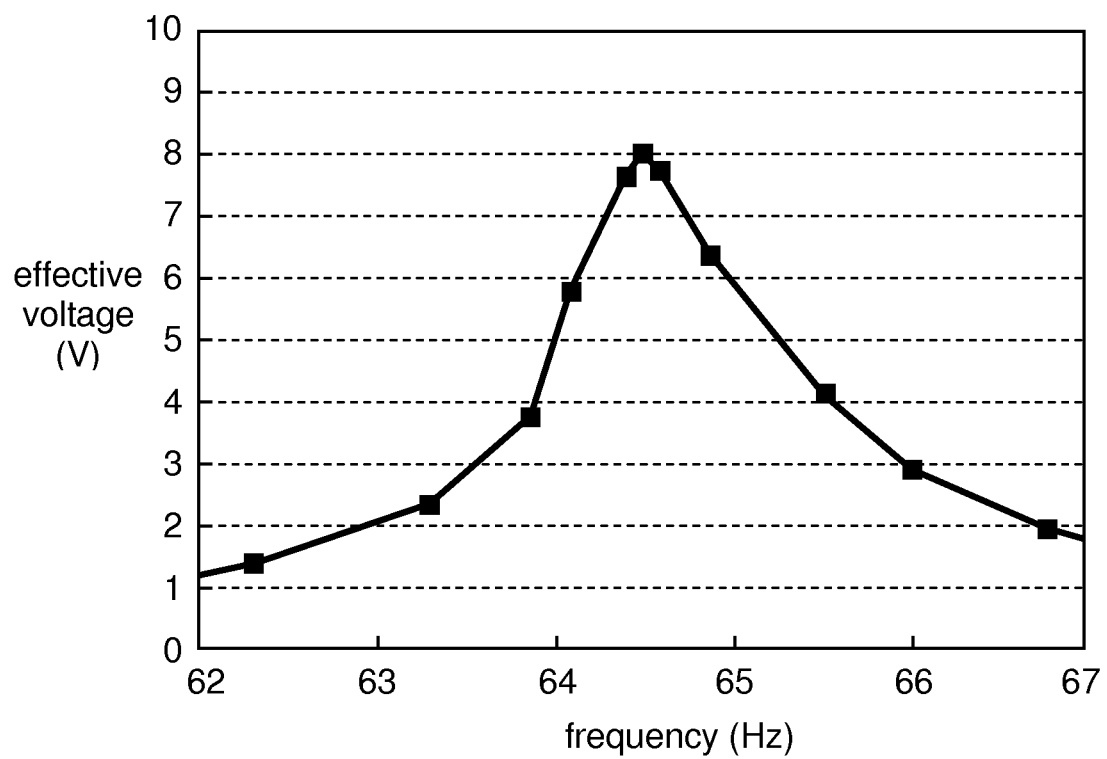
FIG. 3 is a graph showing measurement results of vibration frequencies given to the piezoelectric resonator and voltages generated in a piezoelectric body in accordance with the first exemplary embodiment of the present invention.

FIG. 3 shows measurement results of relation between the vibration frequency given to piezoelectric resonator 1 and the voltage generated in piezoelectric body 4 by the above-mentioned method. Note here that the vibration acceleration is controlled to be constant at 0.1 G by the vibration generator. As shown in FIG. 3, the generated voltage becomes maximum when the vibration frequency is 64.5 Hz, and the voltage (effective value) at that time is about 8 V.

Resonance frequency fr of a cantilever beam provided with a weight of weight W on an end portion thereof is known to be calculated by Rayleigh method from Formula 2.

$$f_r = \frac{1}{2\pi}\sqrt{\frac{3EI}{\left(\frac{33}{144}W + M\right)L^3}} \quad \text{Formula 2}$$

In Formula 2, M denotes a weight, L denotes a length, E denotes Young's modulus, and I denotes a moment of inertia of area of the beam. Assuming that beam part 2 is made of only metal, when a thickness of beam part 2 is 0.17 mm that is a sum of a thickness of the metal substrate of 0.15 mm and a thickness of piezoelectric body 4 of 0.02 mm, and weight W of weight part 6 is 0.38 g, resonance frequency fr calculated from Formula 2 is 65.0 Hz. It is demonstrated that this coincides with a measurement result shown in FIG. 3.

Strictly speaking, thicknesses of lower electrode 3 and upper electrode 5 need to be taken into account, but the thicknesses of lower electrode 3 and upper electrode 5 are extremely thin as compared with the thickness of piezoelectric body 4. Therefore, in this exemplary embodiment, the thicknesses of lower electrode 3 and upper electrode 5 are not taken into account.

Figure 4:
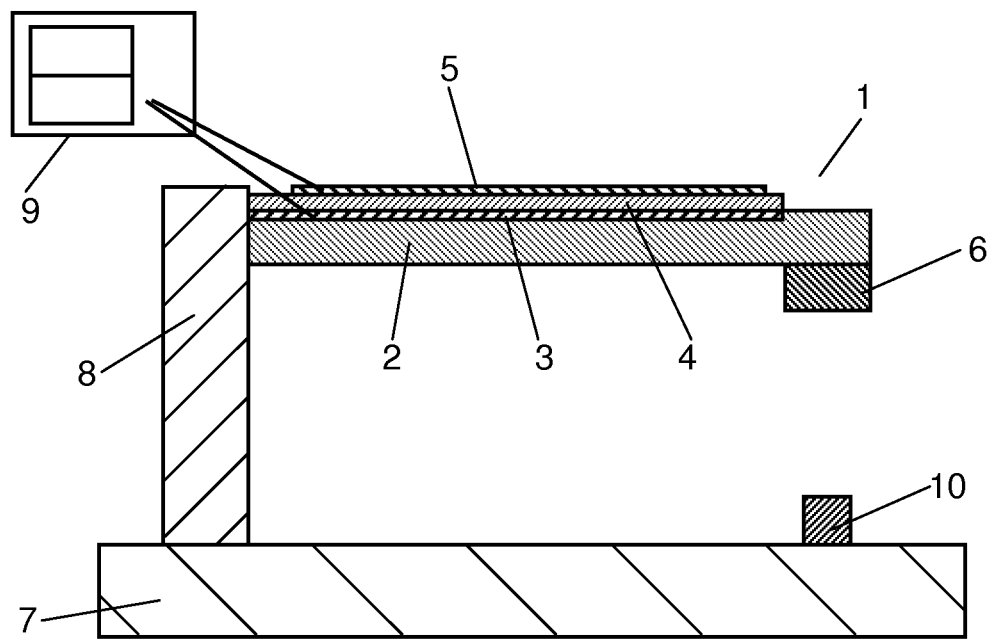
FIG. 4 is a view showing a configuration of a piezoelectric resonator in accordance with the first exemplary embodiment of the present invention.

Next, measurement results of resonance frequencies when adjusting magnet 10 is disposed immediately below weight part 6 made of a permanent magnet (also referred to as "permanent-magnet weight part 6") as shown in FIG. 4 are described. Adjusting magnet 10 is a neodymium permanent magnet having a dimension of 3×3×3 mm and is apart by 15 mm from weight part 6.

Figure 5:
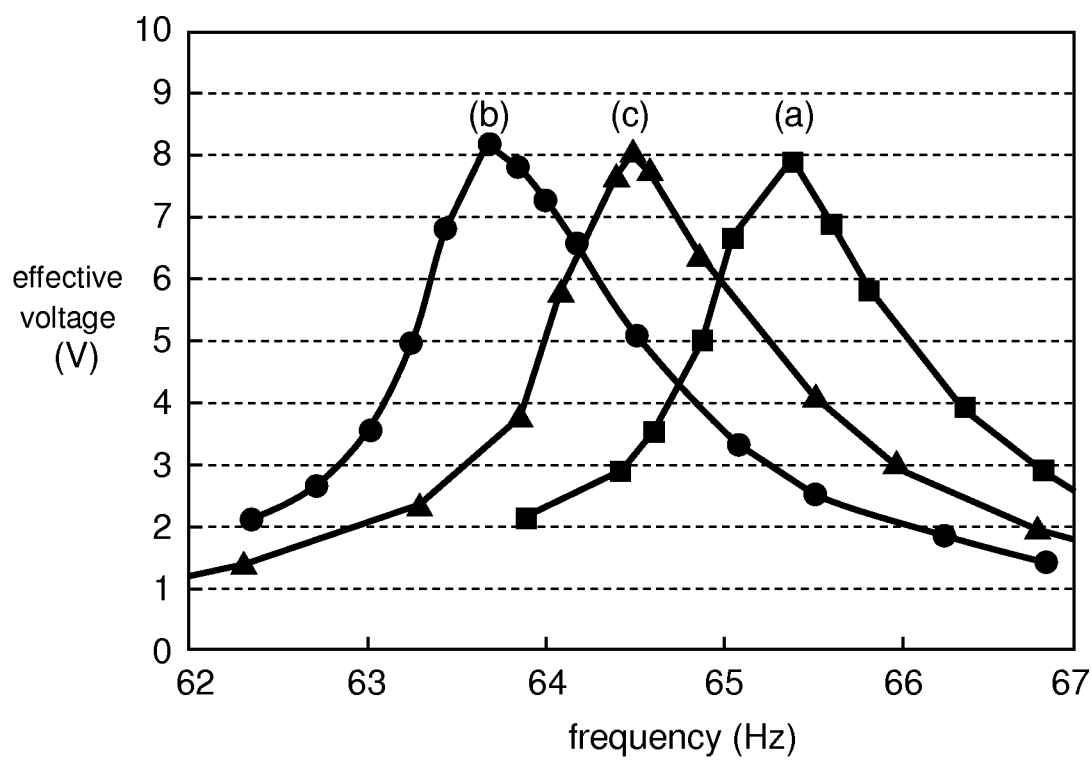
FIG. 5 is a graph showing measurement results of a change of vibration characteristics of a beam with respect to disposition of an adjusting magnet in accordance with the first exemplary embodiment of the present invention.

A line chart shown by (a) in FIG. 5 shows measurement results of vibration frequencies and generated voltages when adjusting magnet 10 is disposed in a direction in which a repelling force is generated between adjusting magnet 10 and weight part 6. At this time, for example, adjusting magnet 10 is disposed such that magnetic poles of adjusting magnet 10 are provided vertically on the main surface of base part 7, and a magnetic pole at an upper surface side of adjusting magnet 10 and a magnetic pole at a lower surface side of weight part 6 are different from each other.

A line chart shown by (b) in FIG. 5 shows measurement results of vibration frequencies and generated voltages when adjusting magnet 10 is disposed in a direction in which an attracting force is generated between adjusting magnet 10 and weight part 6. At this time, for example, adjusting magnet 10 is disposed such that magnetic poles of adjusting magnet 10 are provided vertically on the main surface of base part 7, and the magnetic pole at the upper surface side of adjusting magnet 10 and the magnetic pole at the lower surface side of weight part 6 are the same as each other.

A line chart shown by (c) in FIG. 5 shows measurement results of vibration frequencies and generated voltages when adjusting magnet 10 is not disposed.

The relation of the measurement results shown in FIG. 5 shows the followings.

A resonance frequency when adjusting magnet 10 is disposed in a direction in which a repelling force is generated between adjusting magnet 10 and weight part 6 (graph (a)) is 65.4 Hz, and this resonance frequency is higher by 0.9 Hz than the resonance frequency of 64.4 Hz when adjusting magnet 10 is not disposed (graph (c)).

On the other hand, a resonance frequency when adjusting magnet 10 is disposed in a direction in which an attracting force is generated between adjusting magnet 10 and weight part 6 (graph (b)) is 63.7 Hz, and this resonance frequency is lower by 0.8 Hz than the resonance frequency of 64.4 Hz when adjusting magnet 10 is not disposed (graph (c)).

Furthermore, in any conditions, the generated voltage is about 8 V, which is hardly changed.

As is apparent from the above description, in this exemplary embodiment, the resonance frequency becomes higher when tensile stress is allowed to act on beam part 2, and the resonance frequency becomes lower when a compressive stress is allowed to act on beam part 2. Therefore, when weight part 6 formed of a permanent magnet is fixed to one end portion of beam part 2 and adjusting magnet 10 is disposed immediately below weight part 6, the resonance frequency can be changed.

That is to say, by generating a repelling force and an attracting force between adjusting magnet 10 and weight part 6, tensile stress and compressive stress act on beam part 2, and the resonance frequency can be changed.

Second Exemplary Embodiment

A second exemplary embodiment describes examined results of a change of resonance frequency of piezoelectric resonator 1 when a disposed position of adjusting magnet 10 on a main surface of base part 7 is changed.

Note here that a configuration of a piezoelectric resonator in accordance with the second exemplary embodiment is substantially the same as that of the first exemplary embodiment described with reference to FIG. 4 except that the position of adjusting magnet 10 is varied.

Figure 6:
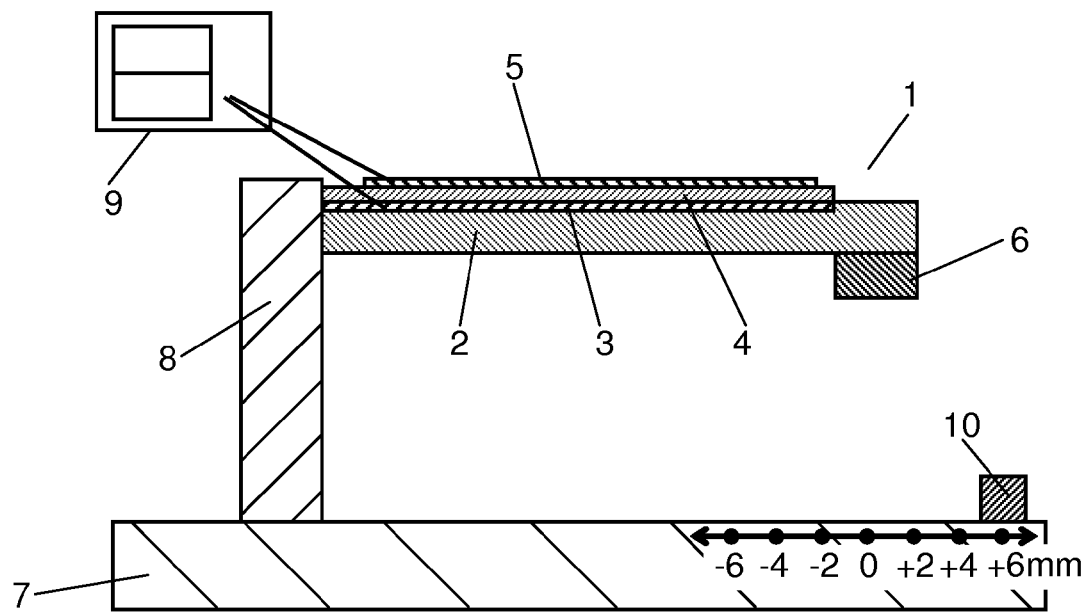
FIG. 6 is a view showing a configuration of a piezoelectric resonator in accordance with a second exemplary embodiment of the present invention.

In the second exemplary embodiment, as shown in FIG. 6, a position immediately below permanent-magnet weight part 6 is defined as position 0. A direction toward support part 8 along the central axis of beam part 2 is defined as minus, and a direction opposite to the direction is defined as plus. Each of the resonance frequencies of piezoelectric resonator 1 is measured when adjusting magnet 10 is disposed in positions at +2, +4, and +6 mm, and positions at −2, −4, and −6 mm. Note here that the adjusting magnet is disposed in such a manner that the central axis in the width direction of beam part 2 and the center of adjusting magnet 10 coincide with each other when adjusting magnet 10 is moved. Adjusting magnet 10 is a neodymium magnet having a dimension of 3×3×3 mm. When adjusting magnet 10 is disposed at position 0, it is apart from weight part 6 with a space of 15 mm.

Figure 7:
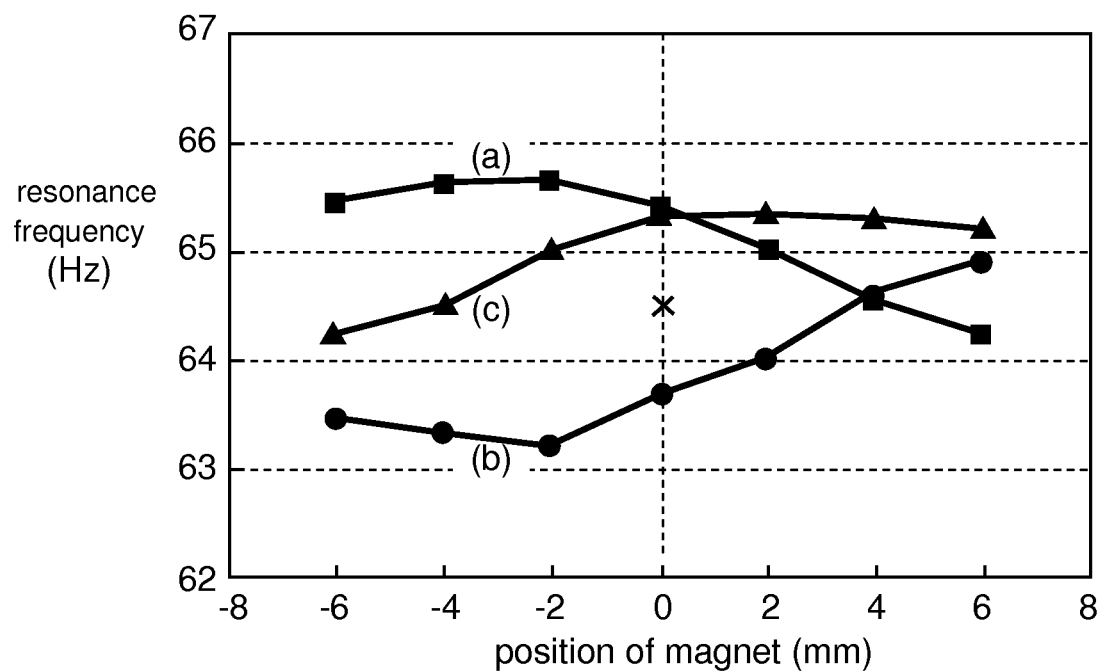
FIG. 7 is a graph showing measurement results of vibration frequencies given to the piezoelectric resonator and voltages generated in a piezoelectric body in accordance with the second exemplary embodiment of the present invention.

A line chart shown by (a) in FIG. 7 shows measurement results of a change of the resonance frequency when adjusting magnet 10 is disposed in positions at −6 to +6 mm in such a manner that a surface that repels permanent-magnet weight part 6 is an upper side. At this time, for example, when a lower surface side of weight part 6 is the N pole, adjusting magnet 10 is disposed such that the S pole and the N pole of adjusting magnet 10 are provided vertically on the main surface of base part 7 and the upper surface side of adjusting magnet 10 is the N pole. That is to say, adjusting magnet 10 and weight 6 are disposed in such a manner that the same poles face each other.

A line chart shown by (b) in FIG. 7 shows measurement results of a change of the resonance frequency when adjusting magnet 10 is disposed in positions at −6 to +6 mm in such a manner that a surface attracted to permanent-magnet weight part 6 is an upper side. At this time, for example, when a lower surface side of weight part 6 is the N pole, adjusting magnet 10 is disposed such that the S pole and the N pole of adjusting magnet 10 are provided vertically on the main surface of base part 7 and the upper surface side of adjusting magnet 10 is the S pole. That is to say, adjusting magnet 10 and weight 6 are disposed in such a manner that the different poles face each other.

A line chart shown by (c) in FIG. 7 shows measurement results of a change of the resonance frequency when adjusting magnet 10 is disposed in the positions at −6 to +6 mm in such a manner that the surface attracted to permanent-magnet weight part 6 is a support part 8 side and the surface that repels weight part 6 is an opposite side to support part 8. At this time, for example, adjusting magnet 10 is disposed such that the S pole and the N pole of adjusting magnet 10 are parallel to each other on the main surface of base part 7, and a different pole from that of weight part 6 is disposed at the support part 8 side, and the same pole as that of weight part 6 is disposed at the opposite side to support part 8 in which the position immediately below weight part 6 is defined as 0.

Note here that mark "x" shown in FIG. 7 denotes a resonance frequency when adjusting magnet 10 is not disposed.

It is shown from the above-mentioned results that when adjusting magnet 10 is disposed in such a manner that the surface that repels permanent-magnet weight part 6 or the surface attracted thereto is the upper side ((a) and (b) in FIG. 7), the resonance frequency is changed substantially linearly in the positions at −2 to +6 mm. It is also shown that the resonance frequencies when adjusting magnet 10 is disposed in the position at +6 mm are opposite in the vertical relation to the resonance frequencies when adjusting magnet 10 is disposed immediately below weight part 6 (on the position at 0 mm) with respect to the resonance frequency when adjusting magnet 10 is not disposed.

That is to say, it is shown that even if the direction of the magnetic pole of adjusting magnet 10 is not changed, by changing the disposition of adjusting magnet 10, the resonance frequency of piezoelectric resonator 1 can be adjusted to be higher or lower as compared with the case where adjusting magnet 10 is not disposed.

Furthermore, when a surface that is attracted to permanent-magnet weight part 6 and a surface that repels permanent-magnet weight part 6 are disposed at the support part 8 side and an opposite side to support part 8, respectively ((c) in FIG. 7), the resonance frequency is changed substantially linearly in the positions at −6 to 0 mm. The resonance frequency when adjusting magnet 10 is disposed in the position at −4 mm is substantially equal to the resonance frequency when adjusting magnet 10 is not disposed. When adjusting magnet 10 is disposed nearer to support part 8 side, the resonance frequency is changed to the low frequency side, and when adjusting magnet 10 is disposed at the opposite side to support part 8, the resonance frequency is changed to the high frequency side.

From the above-mentioned results, in a configuration of this exemplary embodiment, by disposing adjusting magnet 10 on any given positions on the main surface of base part 7 with respect to permanent-magnet weight part 6, the configuration can be used as a fine adjustment mechanism of the resonance frequency of piezoelectric resonator 1.

Note here that in this exemplary embodiment, adjusting magnet 10 is moved and disposed along the direction in which beam part 2 extends. When adjusting magnet 10 is moved and disposed, it is desirable that adjusting magnet 10 is disposed along the central axis of beam part 2. When adjusting magnet 10 is disposed along the central axis of beam part 2, twist or the like is not generated in beam part 2 when the resonance frequency is adjusted, thus enabling the reliability of piezoelectric resonator 1 to be enhanced.

Third Exemplary Embodiment

A third exemplary embodiment describes examined results of a change of a resonance frequency of piezoelectric resonator 1 when a disposed position of adjusting magnet 10 is changed in a vertical direction with respect to a main surface of base part 7.

Figure 8:
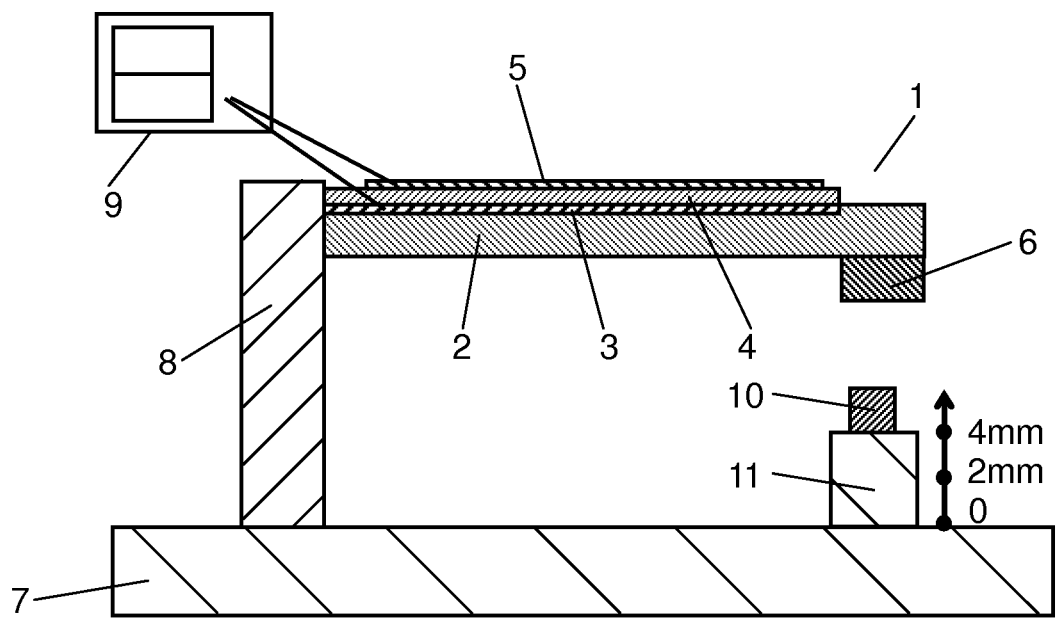
FIG. 8 is a view showing a configuration of a piezoelectric resonator in accordance with a third exemplary embodiment of the present invention.

As shown in FIG. 8, each of magnet fixing members 11 having heights of 2 mm and 4 mm is fixed to the main surface of base part 7 immediately below permanent-magnet weight part 6, and furthermore, adjusting magnet 10 is fixed to base part 7. In this state, the resonance frequency of piezoelectric resonator 1 is measured. Adjusting magnet 10 is formed of a neodymium magnet having a dimension of 3×3×3 mm. A distance between adjusting magnet 10 and weight part 6 is 15 mm when magnet fixing member 11 is not provided, 13 mm when magnet fixing member 11 having a height of 2 mm is provided, and 11 mm when magnet fixing member 11 having a height of 4 mm is provided.

Figure 9:
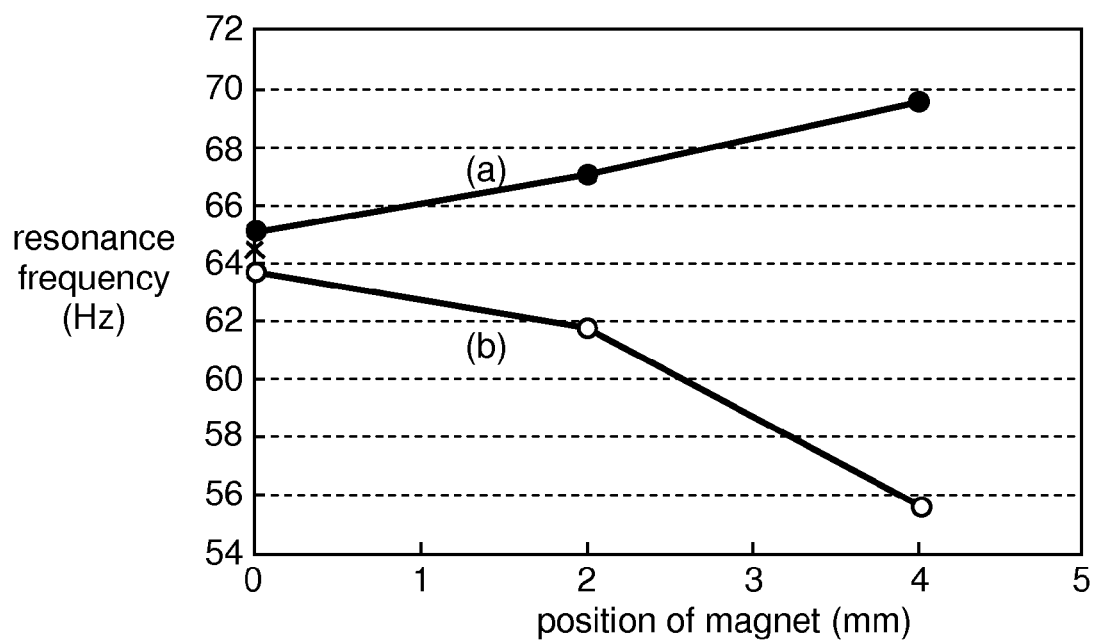
FIG. 9 is a graph showing measurement results of a change of resonance frequencies of a beam with respect to disposition of an adjusting magnet in accordance with the third exemplary embodiment of the present invention.

A line chart shown by (a) in FIG. 9 shows measurement results of the change of the resonance frequency when adjusting magnet 10 is disposed on magnet fixing member 11 in a direction in which a repelling force is generated between adjusting magnet 10 and permanent-magnet weight part 6. At this time, adjusting magnet 10 is disposed such that magnetic poles of adjusting magnet 10 are provided vertically on the main surface of base part 7, and a magnetic pole at an upper surface side of adjusting magnet 10 and a magnetic pole at a lower surface side of weight part 6 are the same as each other.

A line chart shown by (b) in FIG. 9 shows measurement results of the change of the resonance frequency when adjusting magnet 10 is disposed on magnet fixing member 11 in a direction in which an attracting force is generated between adjusting magnet 10 and permanent-magnet weight part 6. At this time, adjusting magnet 10 is disposed such that magnetic poles of adjusting magnet 10 are provided vertically on the main surface of base part 7, and the magnetic pole at the upper surface side of adjusting magnet 10 and the magnetic pole at the lower surface side of weight part 6 are different from each other.

Note here that mark "x" shown in FIG. 9 shows a resonance frequency when adjusting magnet 10 is not disposed.

From the above-mentioned results, it is shown that when adjusting magnet 10 is disposed on magnet fixing member 11 in the direction in which a repelling force is generated between adjusting magnet 10 and permanent-magnet weight part 6 ((a) in FIG. 9), as the height of magnet fixing member 11 becomes higher and the distance between weight part 6 and adjusting magnet 10 is smaller, the resonance frequency changes to the high frequency side. It is shown that when adjusting magnet 10 is disposed on magnet fixing member 11 in the direction in which an attracting force is generated between adjusting magnet 10 and permanent-magnet weight part 6 ((b) in FIG. 9), as the height of magnet fixing member 11 becomes higher and the distance between weight part 6 and adjusting magnet 10 is smaller, the resonance frequency largely changes to the low frequency side.

It is shown that the change of the resonance frequency in this exemplary embodiment shown in FIG. 9 is extremely larger as compared with the results shown in the second exemplary embodiment shown in FIG. 7, and is largely influenced by adjusting magnet 10.

From the above-mentioned results, a configuration in which adjusting magnet 10 can be disposed in any given positions in the vertical direction to the main surface of base part 7 with respect to permanent-magnet weight part 6 is useful as an adjusting mechanism of the resonance frequency of piezoelectric resonator 1.

Furthermore, according to the configuration in which adjusting magnet 10 is disposed in any given positions in the vertical and horizontal directions to the main surface of base part 7 with respect to permanent-magnet weight part 6, the resonance frequency of piezoelectric resonator 1 can be accurately adjusted in a larger frequency range.

Fourth Exemplary Embodiment

Figure 12A:
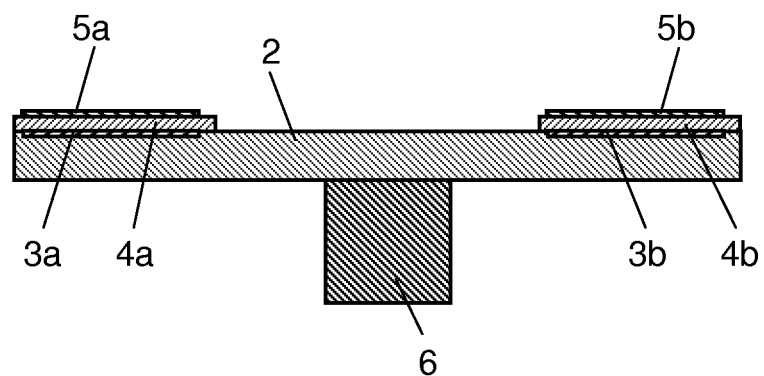
FIG. 12A is a side view showing a configuration of a beam of a piezoelectric resonator in accordance with a fourth exemplary embodiment of the present invention.
Figure 12B:
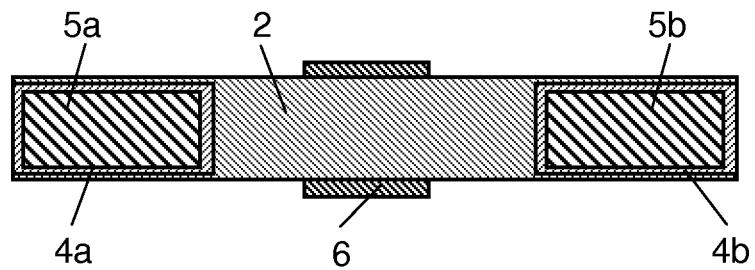
FIG. 12B is a top view showing the configuration of the beam of the piezoelectric resonator in accordance with the fourth exemplary embodiment of the present invention.

A configuration of a beam (a vibration part) of a piezoelectric resonator in accordance with a fourth exemplary embodiment is described with reference to FIGS. 12A and 12B.

<Configuration of Beam Part>

FIG. 12 is a schematic configuration view of a beam (a vibration part) of a piezoelectric resonator in accordance with the fourth exemplary embodiment. Lower electrodes 3a and 3b, piezoelectric layers 4a and 4b, and upper electrodes 5a and 5b are laminated sequentially on a main surface of beam part 2 made of a metal substrate. Weight part 6 is fixed in the vicinity of the center (center portion) of beam part 2. Weight part 6 is made of a permanent magnet or a magnetic body.

Hereinafter, as in the first exemplary embodiment, beam part 2 together with upper electrodes 5a and 5b, lower electrodes 3a and 3b, and piezoelectric bodies 4a and 4b are defined as a beam.

Hereinafter, since a method for manufacturing the vibration part (beam) of the piezoelectric resonator of the present invention is the same as that in the first exemplary embodiment, the description thereof is omitted.

Since a method for producing paste for printing a piezoelectric layer is also the same as in the first exemplary embodiment, the description thereof is omitted.

<Configuration of Piezoelectric Resonator>

Next, a configuration of the piezoelectric resonator in accordance with the fourth exemplary embodiment is described with reference to FIG. 13.

Figure 13:
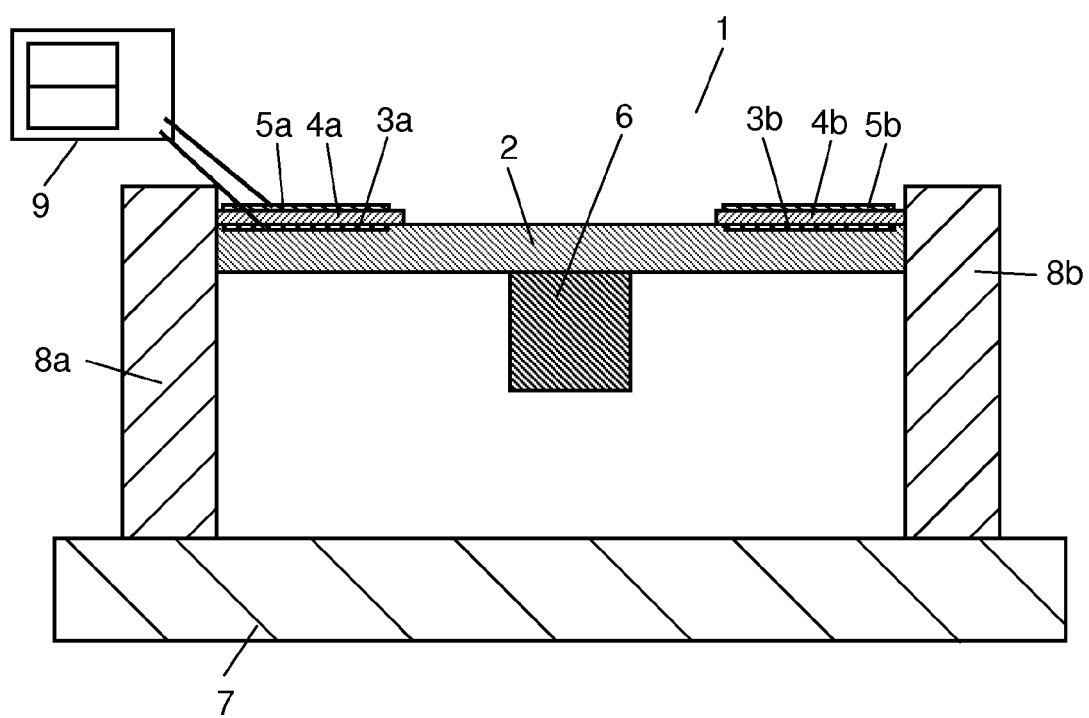
FIG. 13 is a view showing the configuration of the piezoelectric resonator in accordance with the fourth exemplary embodiment of the present invention.

As shown in FIG. 13, in piezoelectric resonator 1 of the fourth exemplary embodiment, both end portions of beam part 2 are fixed by support parts 8a and 8b, respectively, and support parts 8a and 8b are fixed to base part 7. The both end portions of beam part 2 are fixed to support parts 8a and 8b such that at least one main surface of beam part 2 is substantially parallel to the main surface of base part 7. In other words, beam part 2 extends in the direction along the main surface of base part 7.

In this exemplary embodiment, beam part 2, support parts 8a and 8b, and base part 7 are provided as separate members, respectively. However, the same effect can be obtained even when beam part 2, support parts 8a and 8b and base part 7 are formed unitarily.

Since a method for fixing beam part 2, support part 8, and base part 7 is the same as in the first exemplary embodiment, the description thereof is omitted.

<Evaluation Method for Operation Characteristics>

Next, an evaluation method for vibration characteristics of piezoelectric resonator 1 in accordance with the fourth exemplary embodiment of the present invention is described with reference to FIGS. 13 and 14.

Note here that since a measurement method is the same as in the first exemplary embodiment, only measurement results are described hereinafter.

Figure 14:
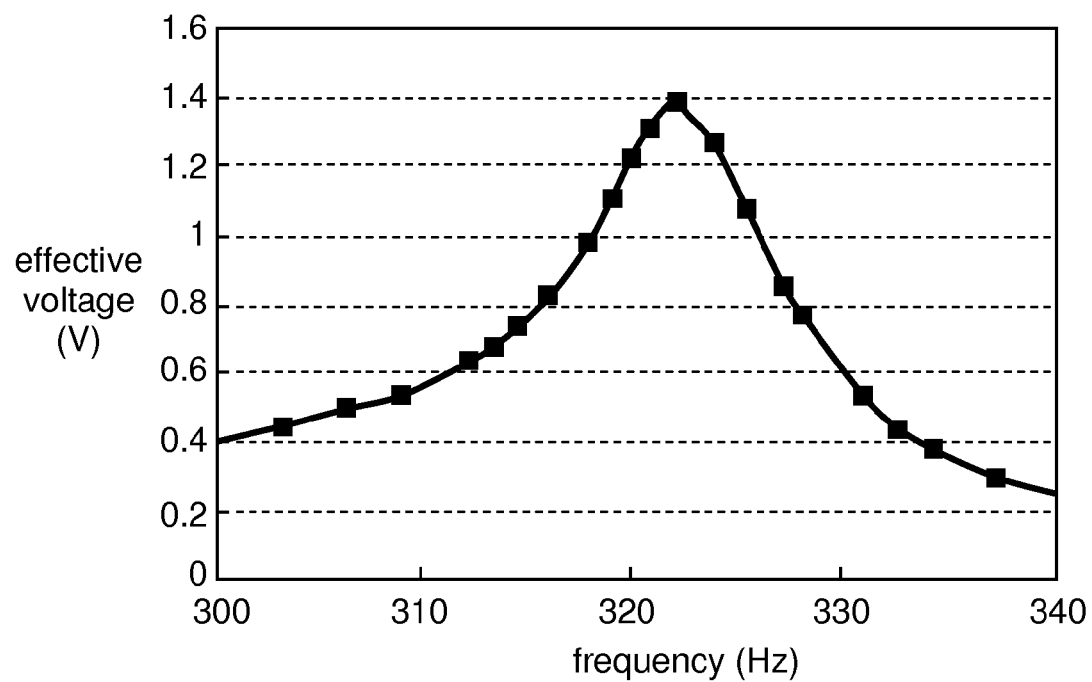
FIG. 14 is a graph showing measurement results of vibration frequencies given to the piezoelectric resonator and voltages generated in a piezoelectric body in accordance with the fourth exemplary embodiment of the present invention.

FIG. 14 is a graph showing measurement results of relation between a vibration frequency given to piezoelectric resonator 1 and a voltage generated in piezoelectric layers 4a and 4b. As shown in FIG. 14, the generated voltage becomes maximum when the vibration frequency is 321.8 Hz, and the voltage (effective value) at the time is about 1.4 V.

Figure 15:
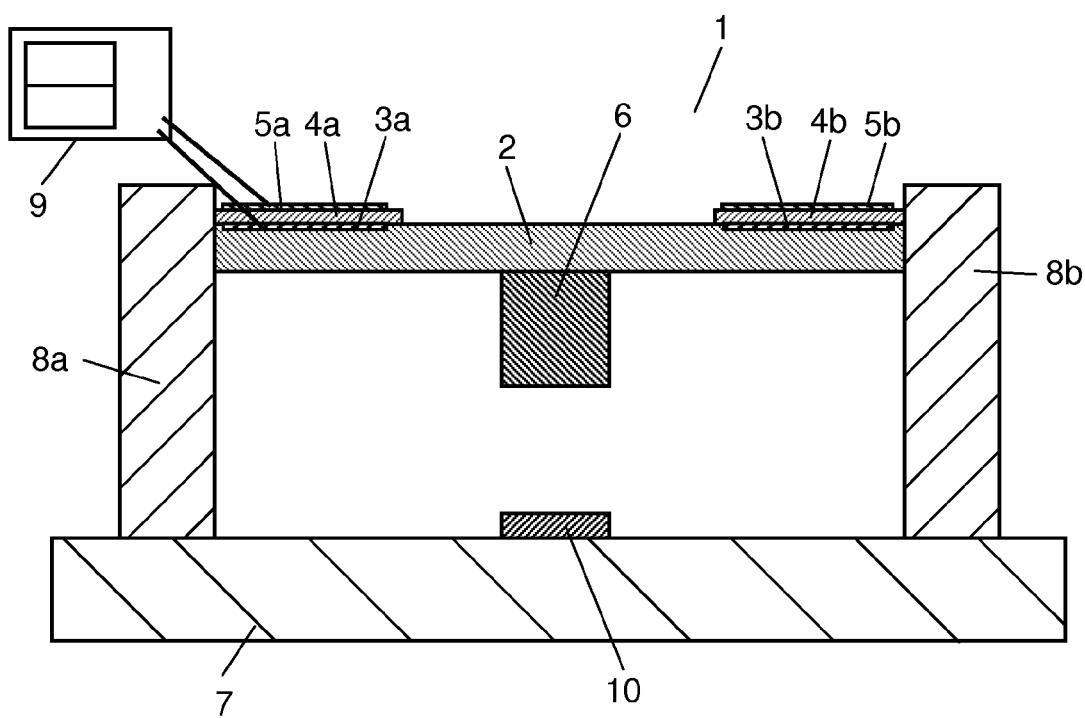
FIG. 15 is a view showing a configuration of a piezoelectric resonator in accordance with the fourth exemplary embodiment of the present invention.

Next, the measurement results of the resonance frequency when adjusting magnet 10 is disposed immediately below permanent-magnet weight part 6 as shown in FIG. 15 is described. Adjusting magnet 10 is a neodymium permanent magnet having a dimension of 5×5×1 mm, and is apart by 5 mm from a lower surface of weight part 6.

When adjusting magnet 10 is disposed in a direction in which a repelling force is generated between adjusting magnet 10 and weight part 6 (for example, when adjusting magnet 10 is disposed in such a manner that a magnetic pole at a top surface side of adjusting magnet 10 and a magnetic pole at a lower surface side of weight part 6 are the same as each other), the vibration frequency is 320.6 Hz, which is lower by 1.2 Hz as compared with the case where adjusting magnet 10 is not disposed. When adjusting magnet 10 is disposed such that an attracting force is generated between adjusting magnet 10 and weight part 6 (when adjusting magnet 10 is disposed in such a manner that the magnetic pole at the top surface side of adjusting magnet 10 and the magnetic pole at the lower surface side of weight part 6 are different from each other), it is shown that the resonance frequency is 322.9 Hz, which is higher by 1.1 Hz as compared with the case where adjusting magnet 10 is not disposed. At this time, the generated voltage is about 1.4 V, which is hardly changed.

Since the resonance frequency is changed when stress is allowed to act on beam part 2, in a configuration of this exemplary embodiment, by generating a repelling force between a permanent magnet fixed as weight part 6 to an end portion of beam part 2 and adjusting magnet 10 disposed immediately below weight part 6, stress acts on beam part 2, and the resonance frequency can be changed.

Fifth Exemplary Embodiment

Figure 16:
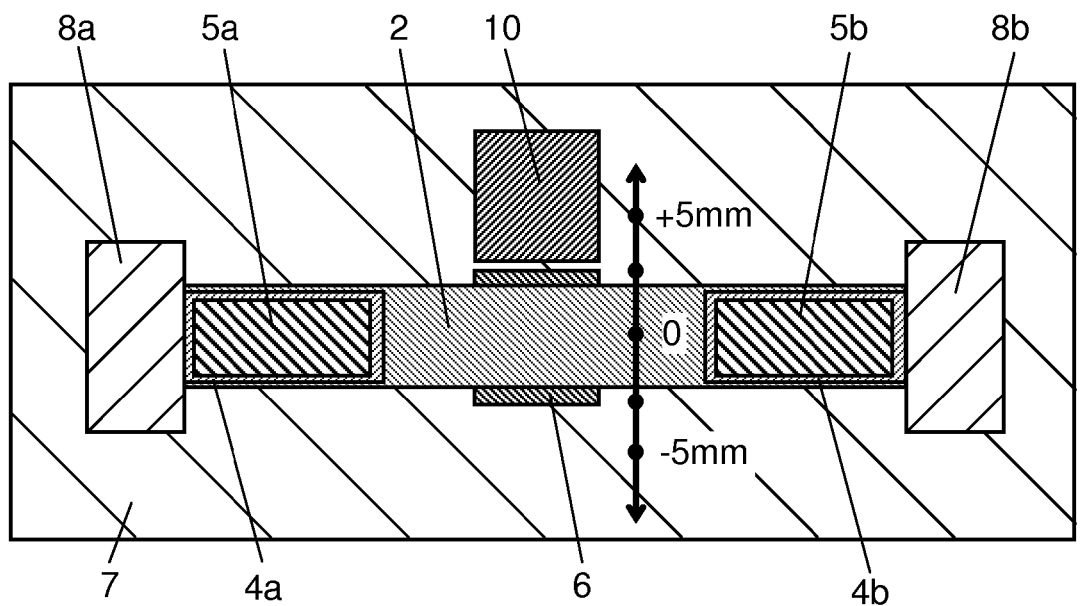
FIG. 16 is a top view showing a configuration of a piezoelectric resonator in accordance with a fifth exemplary embodiment of the present invention.
Figure 18:
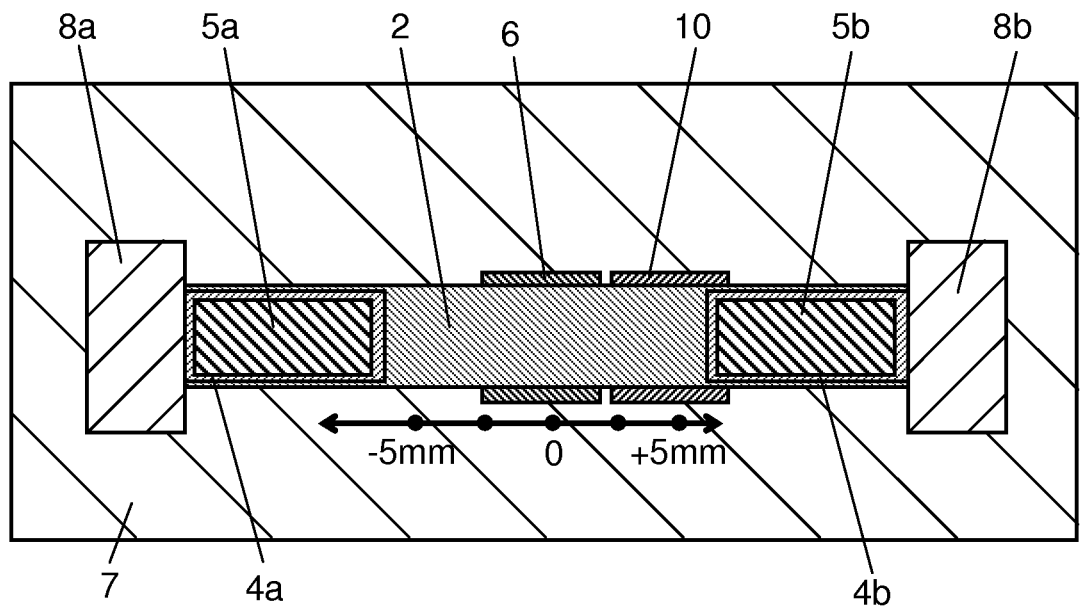
FIG. 18 is a top view showing a configuration of a piezoelectric resonator in accordance with the fifth exemplary embodiment of the present invention.

The fifth exemplary embodiment describes examined results of a change of a resonance frequency of piezoelectric resonator 1 when a disposed position of adjusting magnet 10 in FIGS. 16 and 18 is changed in the planer direction with respect to the main surface of base part 7.

In the fifth exemplary embodiment, as shown in FIG. 16, the disposed position of adjusting magnet 10 is changed in the planer direction with respect to the main surface of base part 7, and in a direction orthogonal to the longitudinal direction of beam part 2. The examined results of a change of a resonance frequency of piezoelectric resonator 1 at this time are described.

A position immediately below permanent-magnet weight part 6 is defined as position 0, any given direction orthogonal to the central axis of beam part 2 is defined as plus, and a direction opposite to the direction is defined as minus. Each of resonance frequencies of piezoelectric resonator 1 is measured when adjusting magnet 10 is disposed in positions at +5 and +2.5 mm, and positions at −2.5 and −5 mm. Adjusting magnet 10 is a neodymium magnet having a dimension of 5×5×1 mm and is apart from weight part 6 with a space of 5 mm when adjusting magnet 10 is disposed at position 0. Adjusting magnet 10 is disposed in such a manner that a surface that repels the weight part 6 is the upper side.

Figure 17:
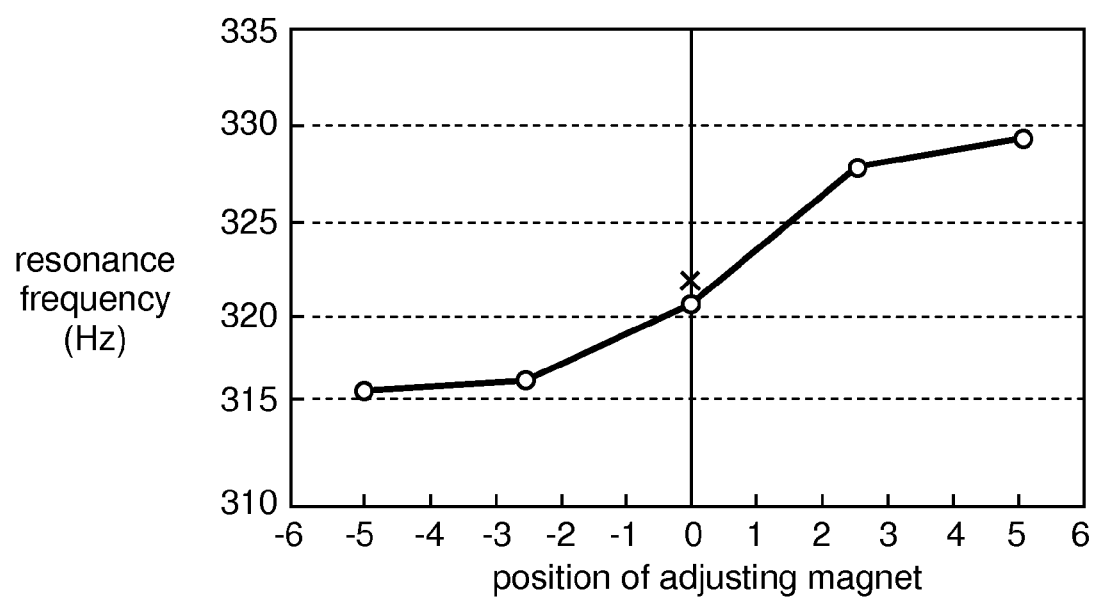
FIG. 17 is a graph showing measurement results of a change of resonance frequencies of a beam with respect to disposition of an adjusting magnet in accordance with the fifth exemplary embodiment of the present invention.

FIG. 17 shows measurement results of a change of the resonance frequency when adjusting magnet 10 is disposed in the positions at −5 to +5 mm. Note here that mark "x" shown in the drawing shows a resonance frequency when adjusting magnet 10 is not disposed.

As shown in FIG. 17, it is shown that when adjusting magnet 10 is disposed in the positions at −5 to +5 mm, the resonance frequency is changed in the range from 315 to 330 Hz. Since the resonance frequency when adjusting magnet 10 is not disposed is 321.8 Hz, it is shown from this result that the resonance frequency of piezoelectric resonator 1 can be adjusted to both high frequency side and low frequency side depending upon the disposed positions of adjusting magnet 10.

Next, as shown in FIG. 18, a change of a resonance frequency of piezoelectric resonator 1 is examined when the disposed position of adjusting magnet 10 is changed in the planer direction with respect to the main surface of base part 7 and along the longitudinal direction of beam part 2.

A position immediately below permanent-magnet weight part 6 is defined as position 0 as a reference position. In this exemplary embodiment, adjusting magnet 10 is disposed in positions at +5 and +2.5 mm sequentially in the right direction (one direction of the longitudinal direction of beam 2) and in positions at −2.5 and −5 mm sequentially in the left direction (the other direction of the longitudinal direction of beam 2) in FIG. 18 and the resonance frequency of piezoelectric resonator 1 is measured in each position. Adjusting magnet 10 is a neodymium magnet having a dimension of 5×5×1 mm and is apart from weight part 6 with a space of 5 mm when adjusting magnet 10 is disposed at position 0. The adjusting magnet is disposed in such a manner that a surface that repels weight part 6 is the upper side.

Figure 19:
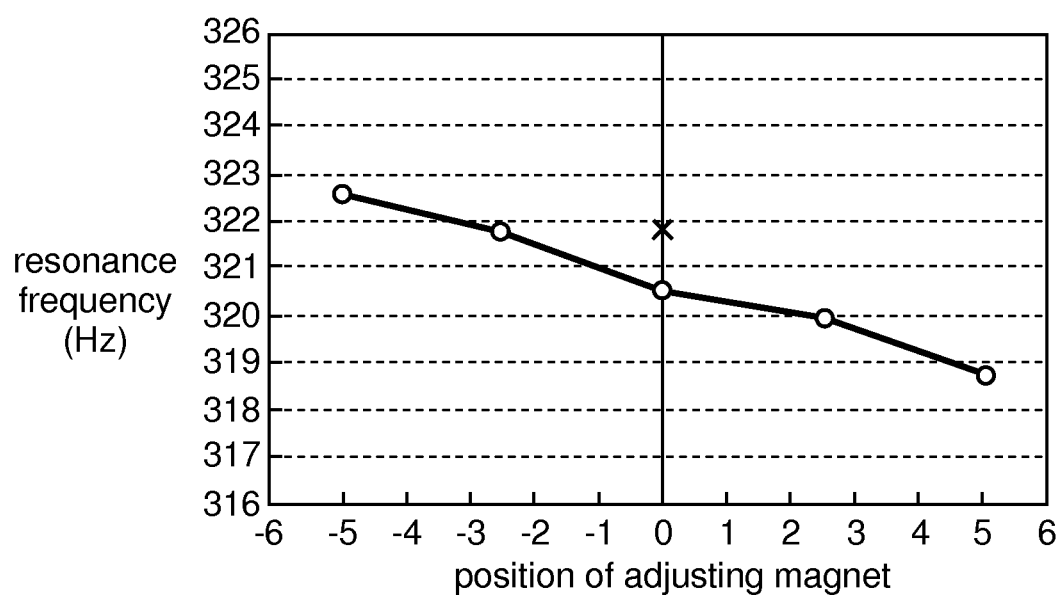
FIG. 19 is a graph showing measurement results of a change of resonance frequencies of a beam with respect to disposition of an adjusting magnet in accordance with the fifth exemplary embodiment of the present invention.

FIG. 19 shows measurement results of a change of the resonance frequency when adjusting magnet 10 is disposed in the positions at −5 to +5 mm. Note here that mark "x" shown in the drawing shows a resonance frequency when adjusting magnet 10 is not disposed. As is apparent from FIG. 19, it is shown that when adjusting magnet 10 is disposed in the positions at −5 to +5 mm, the resonance frequency is linearly changed in the range from 319 to 322.5 Hz.

As is apparent from the above description, a structure in which adjusting magnet 10 is disposed with respect to permanent-magnet weight part 6 in any given positions in the planer direction on the main surface of base part 7 is useful as an adjusting mechanism of the resonance frequency of piezoelectric resonator 1.

Sixth Exemplary Embodiment

A sixth exemplary embodiment describes examined results of a change of a resonance frequency of piezoelectric resonator 1 when a disposed position of adjusting magnet 10 is changed in a vertical direction on a main surface of base part 7.

Figure 20:
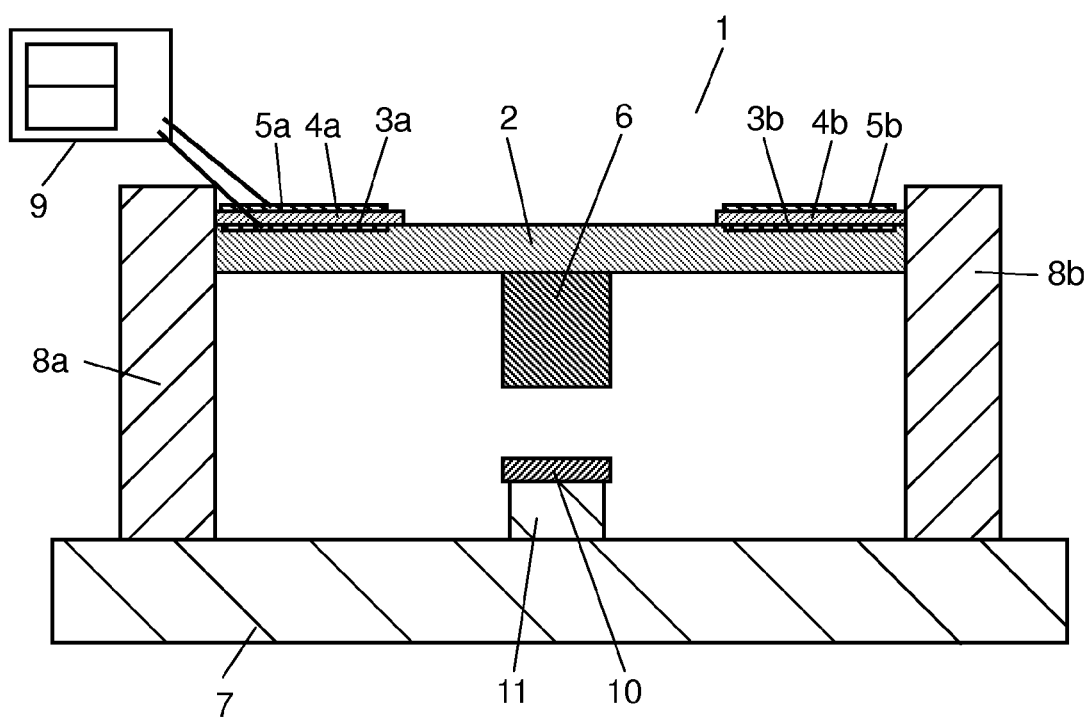
FIG. 20 is a view showing a configuration of a piezoelectric resonator in accordance with a sixth exemplary embodiment of the present invention.

As shown in FIG. 20, each of magnet fixing members 11 having heights of 1 mm and 2 mm is fixed to the main surface of base part 7 immediately below permanent-magnet weight part 6. The resonance frequency of beam part 2 when adjusting magnet 10 is fixed onto magnet fixing member 11 is measured. Adjusting magnet 10 is a neodymium magnet having a dimension of 5×5×1 mm, and a distance to weight part 6 (a distance between a top surface of adjusting magnet 10 and a lower surface of weight part 6) is 5 mm when magnet fixing member 11 is not provided, 4 mm when magnet fixing member 11 having a height of 1 mm is provided, and 3 mm when magnet fixing member 11 having a height of is 2 mm is provided.

Figure 21:
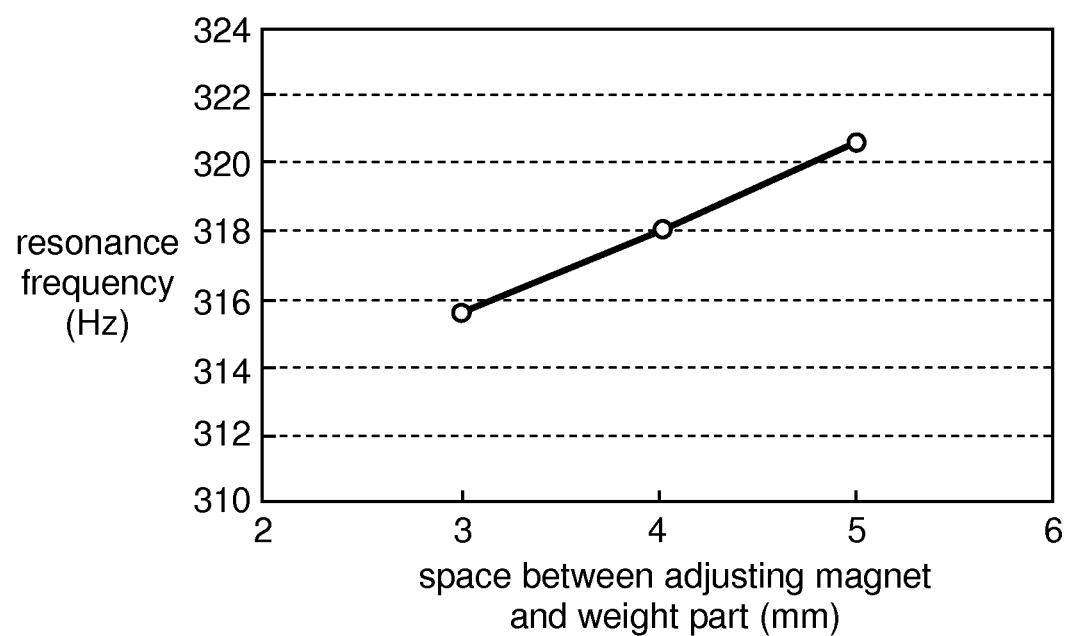
FIG. 21 is a graph showing measurement results of a change of resonance frequencies of a beam with respect to disposition of an adjusting magnet in accordance with the sixth exemplary embodiment of the present invention.

FIG. 21 shows a measurement result of a change of the resonance frequency when adjusting magnet 10 is disposed on magnet fixing member 11 in the direction in which a repelling force is generated between adjusting magnet 10 and permanent-magnet weight part 6.

As shown in FIG. 21, when adjusting magnet 10 is disposed on magnet fixing member 11 in a direction in which a repelling force is generated between adjusting magnet 10 and permanent-magnet weight part 6, as the height of magnet fixing member 11 becomes higher and a space between weight part 6 and adjusting magnet 10 is smaller, the resonance frequency is changed to the low frequency side.

From the above-mentioned results, a structure in which adjusting magnet 10 can be disposed in any given positions in the vertical direction on the main surface of base part 7 with respect to permanent-magnet weight part 6 is useful as an adjusting mechanism of the resonance frequency of piezoelectric resonator 1.

Furthermore, with a structure in which adjusting magnet 10 is disposed in any given positions in the vertical and horizontal directions on the main surface of base part 7 with respect to permanent-magnet weight part 6, the resonance frequency of piezoelectric resonator 1 can be accurately adjusted in a larger frequency range.

Figure 10:
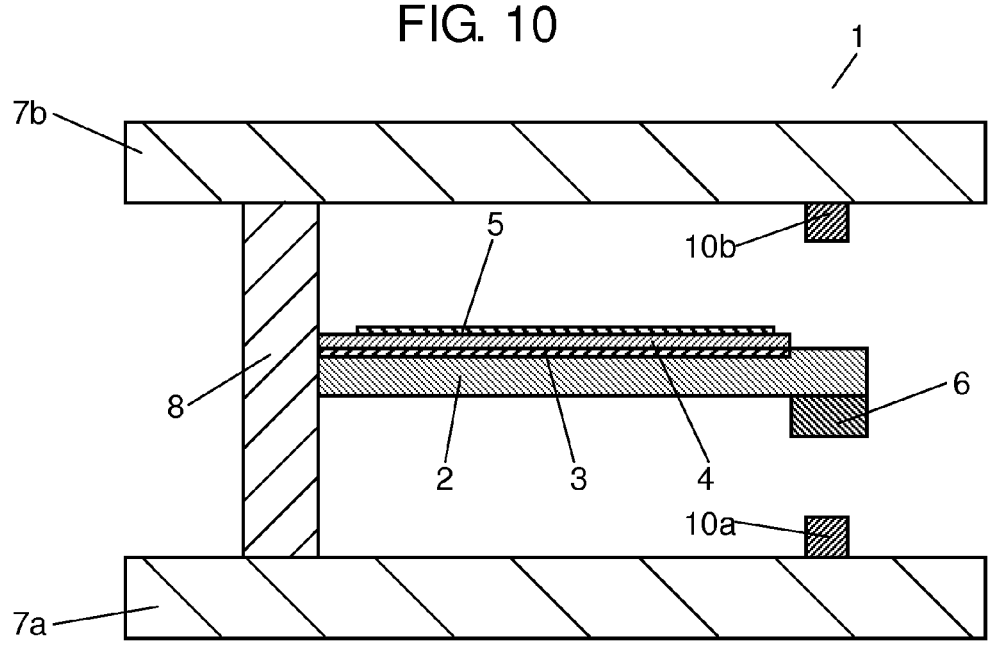
FIG. 10 is a view showing a configuration of a piezoelectric resonator in accordance with a first modification example of this exemplary embodiment.
Figure 22:
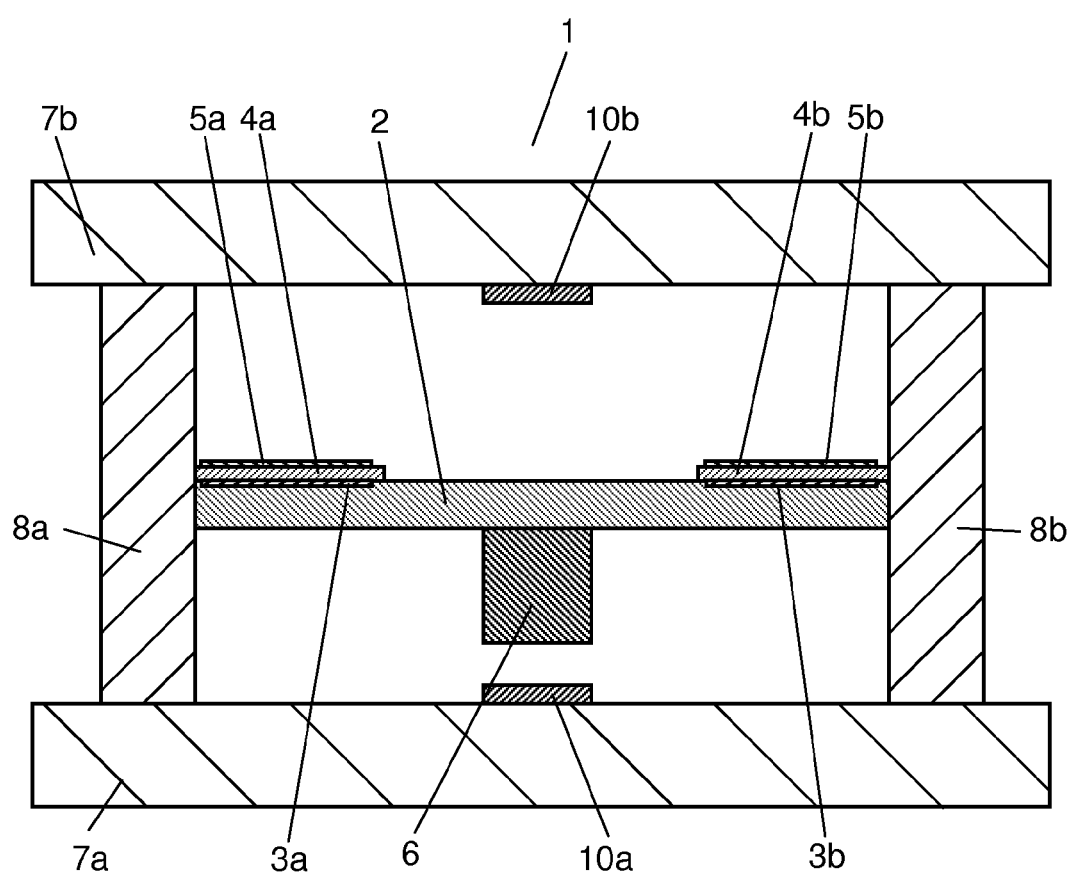
FIG. 22 is a view showing a configuration of a piezoelectric resonator in accordance with a third modification example of this exemplary embodiment.

In the above-mentioned exemplary embodiment, base part 7 and adjusting magnet 10 are provided on only one surface side of beam part 2. However, as shown in FIGS. 10 and 22, base parts 7a and 7b and adjusting magnets 10a and 10b may be provided on both sides with beam part 2 sandwiched therebetween. With the configuration of FIG. 10 or 22, a power supply line can be placed between the main surface of base part 7b and beam part 2. Thus, adjusting magnet 10 does not interfere with the power supply line and piezoelectric resonator 1 can be easily placed.

When piezoelectric resonator 1 of the present invention is used as a power generating element, adjusting magnet 10b that is similar to adjusting magnet 10a provided on the main surface of base part 7a is provided on the main surface of base part 7b, the resonance frequency can be adjusted more precisely and in a wider range.

In this exemplary embodiment, weight part 6 is formed of a permanent magnet, but a part or a whole part of weight part 6 is formed of a permanent magnet or a part or a whole part of weight part 6 is formed of a magnetic body (desirably, a ferromagnetic body such as iron, cobalt, nickel, or an alloy thereof).

Furthermore, any one of weight part 6 and adjusting magnet 10 may be formed of a magnetic body.

In this exemplary embodiment, adjusting magnet 10 is formed of a permanent magnet, but it may be formed of an electromagnet or the like. Electric power is consumed when an electromagnet is used, but the magnetic field direction and the strength of adjusting magnet 10 can be changed freely. Thus, the resonance frequency of piezoelectric resonator 1 can be adjusted in a simple and precise manner.

Furthermore, when adjusting magnet 10 is disposed in a position in which twist stress is generated in beam part 2, long-time vibration of beam part 2 causes rupture due to fatigue. Therefore, it is preferable that adjusting magnet 10 is disposed in a position in beam part 2 in which twist stress is not generated. That is to say, it is desirable that the resonance frequency is adjusted by disposing and moving adjusting magnet 10 along the central axis of beam part 2.

Furthermore, when material of beam 2 is an elastic body, the resonance frequency can be adjusted with the use of twist of beam part 2. In such a case, when adjusting magnet 10 is provided in a direction orthogonal to the central axis of beam part 2, twist can be generated in beam part 2.

In the above-mentioned exemplary embodiments, weight part 6 and beam part 2 are provided as separate members. However, the same effect can be obtained when they are formed unitarily with each other. The same is true to the case of beam part 2, support part 8 (8a and 8b), and base part 7 (7a and 7b), and these may be formed unitarily with each other.

Furthermore, this exemplary embodiment describes an example in which a single adjusting magnet 10 is used for piezoelectric resonator 1, but a plurality of adjusting magnets 10 is disposed as in the configurations shown in FIGS. 10 and 22 in which adjusting magnet 10 is disposed in the upper and lower parts of beam part 2. With this configuration, the resonance frequency can be adjusted more precisely.

The exemplary embodiment in which adjusting magnet 10 is disposed in the planer direction or the vertical direction on the main surface of beam part 2 with respect to the main surface of base part 7 as a reference is described. Adjusting magnet 10 is disposed on the main surface of base part 7, but it may be provided in a position in which a repelling force or an attracting force is generated with respect to weight part 6, and the position is not necessarily limited to the main surface of base part 7. For example, an additional frame or the like may be inserted between base part 7 and beam part 2, and a magnet or the like may be provided on the frame.

Figure 11:
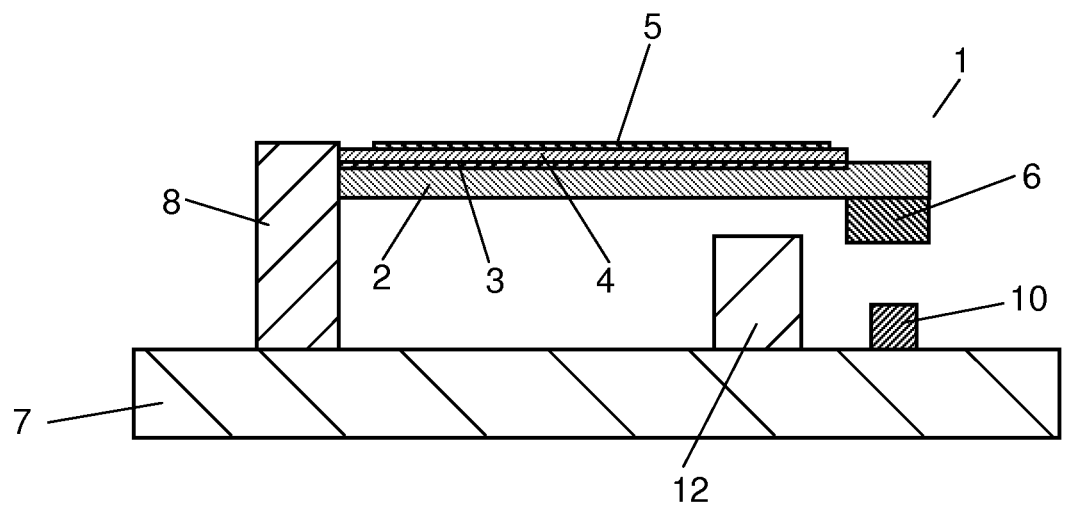
FIG. 11 is a view showing a configuration of a piezoelectric resonator in accordance with a second modification example of this exemplary embodiment.
Figure 23:
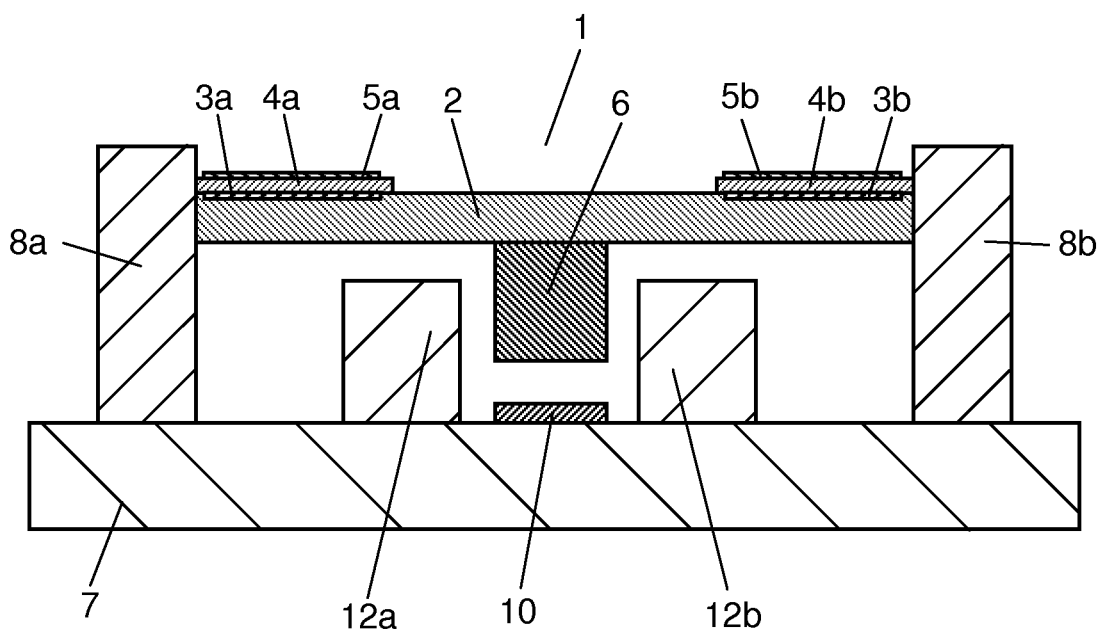
FIG. 23 is a view showing a configuration of a piezoelectric resonator in accordance with a fourth modification example of this exemplary embodiment.
Figure 24:
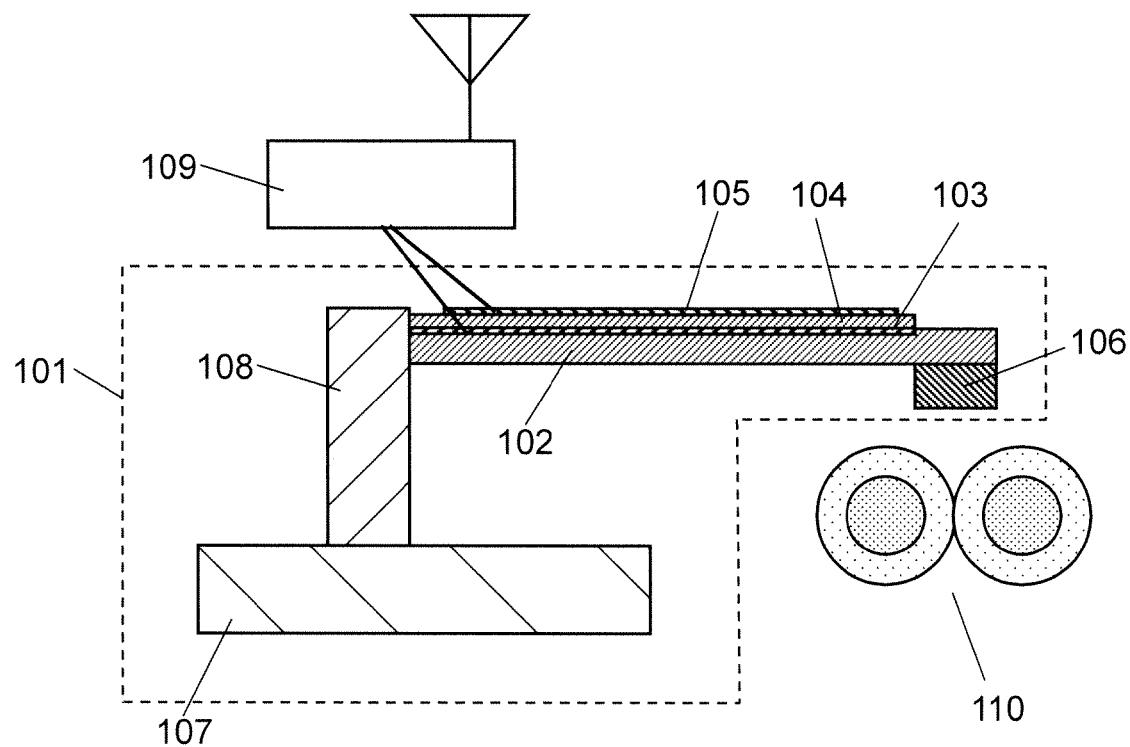
FIG. 24 is a view for illustrating a structure of a conventional power generating element.

Furthermore, in order to avoid a state in which a magnet attached to weight part 6 and adjusting magnet 10 are attracted to each other and they cannot move due to a magnetic force, stoppers 12, 12a, and 12b, which limit an vibration amount of beam part 2, may be provided as shown in FIGS. 11 and 23. It is desirable that stoppers 12, 12a, and 12b are an elastic body so that they are not broken even if beam part 2 collides with them, and they are disposed in such a manner that the top surfaces thereof are higher than at least the top surface of adjusting magnet 10.

INDUSTRIAL APPLICABILITY

The present invention is useful in application as piezoelectric devices, such as a vibration power generating element and an oscillator, using resonance characteristics of cantilever beams.

The invention claimed is:

1. A piezoelectric resonator comprising:
   a base part;
   a first support part fixed to the base part;
   a beam part fixed to the first support part;
   a weight part fixed to the beam part;
   a drive unit provided on the beam part; and
   an adjusting magnet movable on a main surface of the base part along a direction different from a direction connecting the adjusting magnet and the weight part,
   wherein the weight part is formed of a magnet or a magnetic body, and
   the beam part extends in a direction along the main surface of the base part.

2. The piezoelectric resonator of claim 1, wherein the first support part is fixed to a first end portion of the beam part, and the weight part is fixed to a second end portion of the beam part.

3. The piezoelectric resonator of claim 2, wherein the adjusting magnet is movable along a central axis of the beam part.

4. The piezoelectric resonator of claim 1, further comprising a second support part,
   wherein the first support part is fixed to a first end of the beam part, the second support part is fixed to a second end of the beam part, and the weight part is fixed to a center portion of the beam part.

5. The piezoelectric resonator of claim 4, wherein the adjusting magnet is movable from a position below the weight part along a direction orthogonal to a central axis of the beam part.

6. The piezoelectric resonator of claim 1, wherein the drive unit includes a lower electrode, a piezoelectric body, and an upper electrode, and the lower electrode, the piezoelectric body, and the upper electrode are sequentially laminated on the beam part.

7. The piezoelectric resonator of claim 1, wherein the adjusting magnet is formed of an electromagnet.

8. The piezoelectric resonator of claim 1, wherein a space between the adjusting magnet and the weight part is adjustable.

9. The piezoelectric resonator of claim 1, further comprising a stopper, wherein the stopper is disposed on the main surface of the base part, and a height of the stopper is higher than a height of the adjusting magnet.

10. The piezoelectric resonator of claim 6, wherein the piezoelectric body has a portion exposed from the upper electrode.

* * * * *